United States Patent
Bolz

(10) Patent No.: US 6,914,434 B2
(45) Date of Patent: Jul. 5, 2005

(54) DRIVER CIRCUIT

(75) Inventor: Stephan Bolz, Pfatter (DE)

(73) Assignee: Siemens Aktiengesellschaft, Munich (DE)

(*) Notice: Subject to any disclaimer, the term of this patent is extended or adjusted under 35 U.S.C. 154(b) by 79 days.

(21) Appl. No.: 10/349,122

(22) Filed: Jan. 22, 2003

(65) Prior Publication Data

US 2003/0141873 A1 Jul. 31, 2003

(30) Foreign Application Priority Data

Jan. 22, 2002 (DE) .......................................... 102 02 289

(51) Int. Cl.[7] .............................. F02P 17/00; F02P 3/12
(52) U.S. Cl. ....................... 324/380; 324/378; 123/644
(58) Field of Search ................. 324/378, 380, 324/388; 73/116, 35, 35.08; 123/425, 644

(56) References Cited

U.S. PATENT DOCUMENTS

| 4,380,989 | A | | 4/1983 | Takaki ......................... 123/644 |
|---|---|---|---|---|
| 4,453,194 | A | | 6/1984 | Frankeny et al. ............ 361/154 |
| 5,043,655 | A | | 8/1991 | Anholm, Jr. et al. ...... 324/73.1 |
| 5,722,378 | A | * | 3/1998 | Sawazaki et al. ........... 123/644 |
| 5,781,012 | A | * | 7/1998 | Yasuda ......................... 324/399 |
| 6,075,366 | A | * | 6/2000 | Yasuda ......................... 324/380 |
| 6,275,041 | B1 | * | 8/2001 | Okamura et al. ........... 324/380 |
| 6,278,278 | B1 | | 8/2001 | Fisch .......................... 324/380 |

FOREIGN PATENT DOCUMENTS

| DE | 19630305 | 12/1998 | ............ F02P/17/00 |
|---|---|---|---|
| DE | 19729904 | 1/1999 | ......... G01R/19/165 |
| DE | 197 29 904 A1 | 2/1999 | ......... G01R/19/165 |
| DE | 199 00 978 A1 | 7/2000 | ............ B60R/21/32 |
| DE | 19900978 | 7/2000 | ............ B60R/21/32 |
| EP | 0373694 | 6/1990 | ............ F02P/3/055 |

OTHER PUBLICATIONS

Habiger, E. U.A.: Elektromagnetische Vertraglichkeit, Verlag Technik Berlin Munchen, 2. Auflage 1992, ISBN 3-341-00993-0, S. 566, 567.

* cited by examiner

Primary Examiner—Anjan Deb
Assistant Examiner—John Teresinski
(74) Attorney, Agent, or Firm—Baker Botts L.L.P.

(57) ABSTRACT

Driver circuit (1) for actuating an electrical device via a control line (3) and for diagnosing the state of the control line (3) and/or of the actuated device, having a test circuit (Q1–Q6, R1–R6), connected to the control line (3), for measuring the electrical output current flowing via the control line (3), and an evaluation unit (5–8), connected to the test circuit, for generating a diagnostic signal (DIAG) on the basis of the measured output current, the test circuit having at least one current mirror circuit (Q1, Q2; Q4–Q5).

18 Claims, 3 Drawing Sheets

DRIVER CIRCUIT

PRIORITY

This application claims foreign priority of the German application DE 10202289.5 filed on Jan. 22, 2002.

BACKGROUND OF THE INVENTION

The invention relates to a driver circuit for actuating an electrical device via a control line and for diagnosing the state of the control line and/or of the actuated device In modern, electronically controlled internal combustion engines, the ignition output stage is known to be actuated by the electronic engine controller using line drivers, with the line drivers needing to meet various requirements.

By way of example, the line drivers need to produce rapid switching edges having a switching time of just 0.5–2 $\mu s$ even if a capacitor is grounded at the output of the line driver for the purpose of EMC suppression.

In addition, the line drivers need to be sufficiently resistant to ground and battery shorting and to any interruption in the control line.

Finally, the line drivers need to allow diagnosis of shorting to ground or to battery voltage and of any line interruption.

To achieve this diagnostic object, line drivers are known which measure the output current and compare it with the normal load current in order to be able to identify a fault in the event of any discrepancy. Thus, ground shorting results in a rise in current beyond the normal load current, while battery shorting and line interruption result in a reduction in the output current.

However, a problem in this regard is that the output current from the line driver during the turn-on phase is initially determined by the relatively large charging current for the EMC capacitor, which means that it is not possible to detect fault-related discrepancies in the much smaller load current. Thus, the charging current for the EMC capacitor can be 40 mA for example, while the normal load current is just 20 $\mu A$.

In the known line drivers, the diagnostic function is therefore not available until the EMC capacitor has been largely charged and the charging current has decayed accordingly, so that fault-related discrepancies in the load current can be detected.

A drawback of the known line drivers described above is thus that dynamic identification of a line interruption is not possible during the turn-on phase.

In addition, line drivers are known which impress a small output current of, by way of example, 10 $\mu A$ on the control line during the turn-on phase, with the voltage rise at the output of the line driver being measured. With a fault-free control line, only a portion of this output current charges the EMC capacitor, while the other portion flows via the load and thereby delays the build-up of voltage on the EMC capacitor. By contrast, in the event of a fault-related line interruption, the total output current contributes to the build-up of voltage on the EMC capacitor, so that the voltage rise is faster in the event of a line interruption. Measuring the voltage rise during the turn-on phase therefore allows a line interruption to be identified for this line driver type.

However, a drawback of this is that a line interruption can no longer be identified in this manner during normal operation after the turn-on phase, since a constant current cannot be impressed during normal operation.

U.S. Pat. No. 5,043,655 discloses a circuit tester which uses two current mirror circuits to measure the current flowing out of the test piece or into the test piece, the measured value being compared with a prescribed reference value in order to identify any faults in the test piece.

In addition, DE 199 00 978 A1 discloses a circuit arrangement for ascertaining a resistance for an ignition element for an airbag in order to be able to identify a fault in the ignition element. To this end, a small test current is supplied to the ignition element and is evaluated using two current mirror circuits. In this context, the ignition element is activated by a separate occupant protection means control arrangement, however.

Also, DE 197 29 904 A1 discloses a circuit arrangement for monitoring currents flowing through a load, which likewise has a current mirror circuit. This circuit arrangement can actuate the load with high levels only, however.

Finally, HABIGER: "Handbuch Elektromagnetische Verträglichkeit" [Electromagnetic Compatibility Manual], 2nd edition (Verlag Technik GmbH Berlin) discloses, generally, measures for ensuring electromagnetic compatibility.

SUMMARY OF THE INVENTION

The invention is therefore based on the object of improving the known line driver type described in the introduction such that a line interruption can be identified both during the turn-on phase and in normal operation.

This object can be achieved by a driver circuit for actuating an ignition output stage in an internal combustion engine via a control line and for diagnosing the state of the control line and/or of the ignition output stage, having a test circuit, connected to the control line, for measuring the electrical output current flowing via the control line, and an evaluation unit, connected to the test circuit, for generating a diagnostic signal on the basis of the measured output current, wherein the test circuit has two current mirror circuits, the first current mirror circuit being connected to the voltage side of the control line while the second current mirror circuit is connected to the ground side of the control line, and in that the evaluation unit has two comparator units which respectively compare the output current or a signal derived from the output current with a prescribed threshold value and generate the diagnostic signal on the basis of the comparison.

The current mirror circuit can be in the form of an inverse current mirror circuit. The control line can be grounded via a first capacitor in order to improve the electromagnetic compatibility. The input side of the evaluation unit can be grounded via a buffer capacitor. The input side of the evaluation unit can be grounded via an RC element. The time constant of the RC element can be smaller than the switching time or is in the order of magnitude of the switching time. The time constant of the RC element can be between 5 $\mu s$ and 20 $\mu s$. The outputs of the two comparator units can be connected to a logic circuit which generates the diagnostic signal on the basis of the output signal from the two comparator units. The logic circuit can have an OR gate. The inputs of the current mirror circuits can be connected to a single control input together. The inputs of the two current mirror circuits can be connected to a respective control input separately.

The invention comprises the general technical disclosure of the practice of providing the output side of the line driver with a current mirror circuit which converts the output current from the driver circuit into a test current which is then evaluated in order to identify a line interruption or a short circuit.

Such current mirror circuits are known to a person skilled in the art, which means that it is possible to dispense with a detailed description of all the embodiments of current mirror circuits, and reference is made merely by way of example to PHILIPPOW, Eugen: Bauelemente und Bausteine der Elektrotechnik [Components and Modules in Electronics], 3rd edition, volume 3, page 669.

The inventive use of a current mirror circuit advantageously allows dynamic identification of a line interruption and the identification of ground and battery shorting on the output-side control line.

In addition, the inventive circuit advantageously tolerates shorting to battery voltage and to ground in all switching states.

Finally, the inventive circuit can be produced inexpensively and is suitable for integration in an IC.

In the preferred embodiment, the current mirror circuit is in the form of an inverse current mirror and is preferably switchable in order to permit not only the diagnostic function but also actuation of the desired levels on the control line, with the output preferably being overdriven for high-side use. Deliberately overdriving the output of the current mirror circuit advantageously allows detection of a load current in the range below 20 $\mu$A.

The output side of the current mirror circuit is preferably connected to a comparator unit which compares the test current, converted from the output current by the current mirror circuit, with a prescribed threshold value and generates a diagnostic signal on the basis of the comparison. Thus, by way of example, the comparator unit can generate a fault signal if the test current derived from the output current falls below a prescribed threshold value, which indicates line breakage.

The input side of the comparator unit is preferably connected to a buffer capacitor or to an RC element in order to prevent interference during a switching operation. The time constant of the RC element is therefore preferably smaller than the switching time or is at least in the order of magnitude of the switching time. Thus, the time constant of an RC element at the input of the comparator unit can assume values in the region of 5 $\mu$s and 20 $\mu$s, for example.

In the preferred embodiment, the inventive driver circuit has two current mirror circuits, the first current mirror circuit being connected to the voltage side of the control line while the second current mirror circuit is connected to the ground side of the control line. Firstly, the two current mirror circuits preferably allow a high level and a low level to be generated on the control line, for example in order to be able to actuate an ignition output stage. Secondly, the two current mirror circuits together allow identification of a line interruption and of battery and ground shorting.

The two current mirror circuits are preferably actuated together by one control input connected to the electronic engine controller, for example.

In one variant of the invention, the two current mirror circuits are, by contrast, actuated separately by a respective control input. This affords the advantage that the driver circuit can be configured either as a high-side switch or as a low-side switch. Another advantage of separate actuation of the two current mirror circuits is that the driver circuit can be put into a high-impedance state (tri-state) by turning off both output transistors.

BRIEF DESCRIPTION OF THE DRAWINGS

Other advantageous developments are characterized in the subclaims or are explained in more detail below together with the description of the preferred exemplary embodiment of the invention with reference to the figures, in which:

DETAILED DESCRIPTION OF THE PREFERRED EMBODIMENTS

The text below first describes the structural design of the circuit shown in FIG. 1, which will then be followed by an explanation of the way in which it works.

Figure 1:
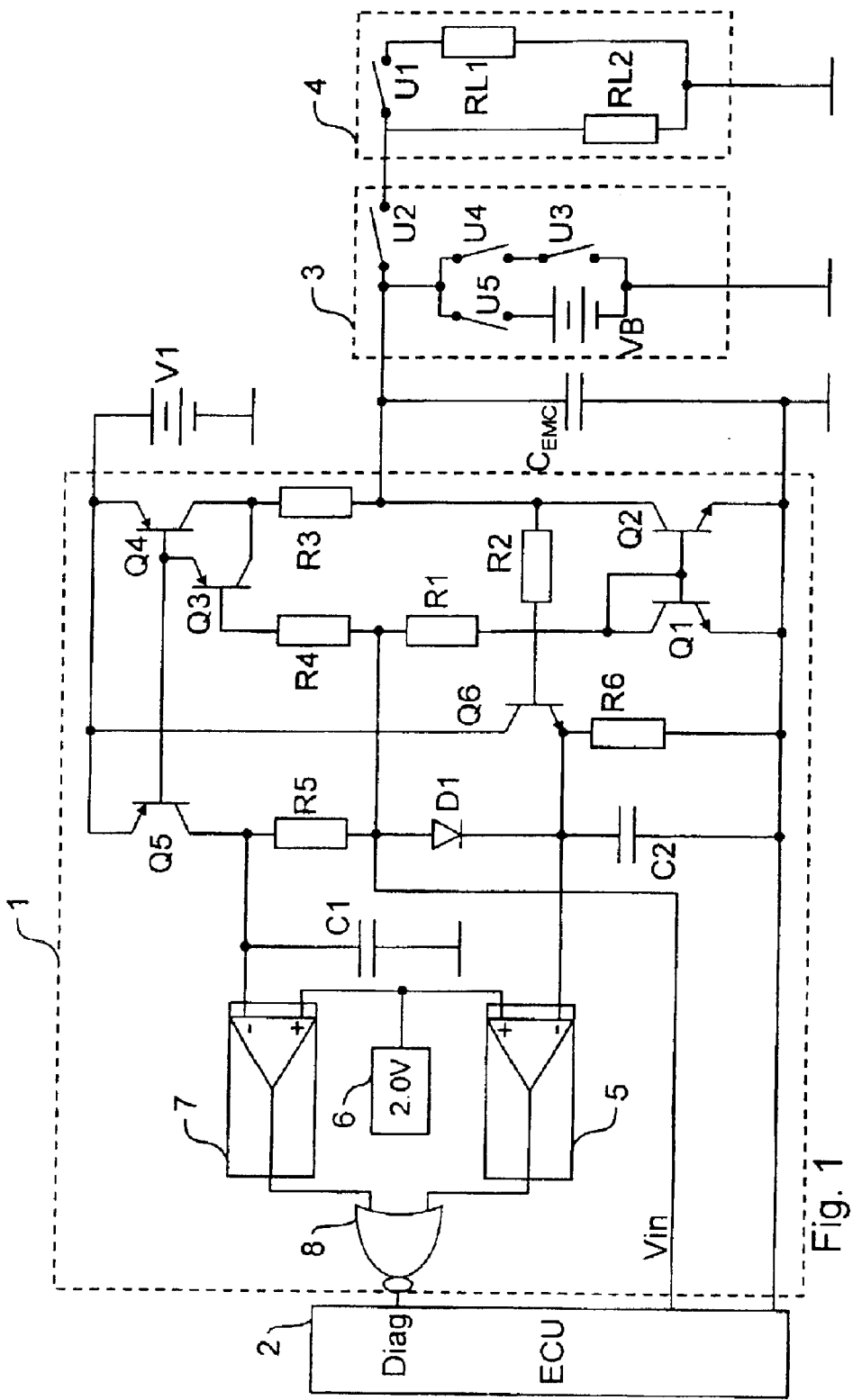
FIG. 1 shows an inventive driver circuit in the form of a circuit diagram.

The circuit diagram shown in FIG. 1 shows an inventive driver circuit 1 which is actuated by an electronic engine controller 2 (ECU—Electronic Control Unit) using a control input Vin, with the driver circuit 1 also returning a diagnostic signal DIAG to the engine controller 2, as will subsequently be explained in detail.

The output side of the driver circuit 1 is connected by means of a schematically shown control line 3 to an ignition output stage 4, which is likewise shown only schematically.

In this context, the ignition output stage 4 is shown as an equivalent circuit diagram comprising a switch U1 and two load resistors RL1=2 k$\Omega$ and RL2=200 k$\Omega$. The switch U1 in this case allows the load resistance of the ignition output stage 4 to be varied in line with the respective operating state of the ignition output stage.

The control line 3 is also shown as an equivalent circuit diagram, comprising a battery VB and a plurality of switches U2, U3, U4 and U5, in this case. In this context, opening the switch U2 corresponds to a line interruption, while closing the switch U5 simulates a battery short. Finally, closing the switches U3 and U4 corresponds to a ground short on the control line 3.

To actuate the control line 3 with a high level or with a low level and for diagnostic purposes, the driver circuit has two current mirror circuits.

The first current mirror circuit is connected to the voltage side of the control line 3 and comprises three transistors Q3, Q4 and Q5.

By contrast, the second current mirror circuit is connected to the ground side of the control line 3 and comprises the transistors Q1, Q2 and Q6.

The two current mirror circuits are actuated by the electronic engine controller 2 via the common control input Vin, which is connected to the collector of the transistor Q1 via a resistor R1=430 $\Omega$ and to the base of the transistor Q3 via a resistor R4=100 k$\Omega$.

The control line 3 is connected to a supply voltage V1=5V via the transistor Q4 and a resistor R3=100 $\Omega$ and to ground via the transistor Q2. The control line 3 is thus at a high level when the transistor Q4 is on, whereas the control line 3 assumes a low level when the transistor Q2 is on.

The low-side transistor Q2 is actuated by the transistor Q1, with the two transistors Q1 and Q2 forming a current mirror. The base of the transistor Q2 is therefore connected both to the base of the transistor Q1 and to the collector of the transistor Q1, while the emitters of the two transistors Q1 and Q2 are both grounded. The current through the transistor Q1 is therefore equal to the current through the transistor Q2.

Similarly, the collectors of the two transistors Q4 and Q5 in the high-side current mirror circuit are also connected to one another. In addition, the high-side current mirror circuit contains the transistor Q3, whose emitter is connected to the junction point between the resistor R3 and the transistor Q4, while the collector of the transistor Q3 is connected to the base of the transistor Q4.

For diagnostic purposes, the driver circuit 1 also contains a transistor Q6 whose collector is connected to the supply voltage V1, while the emitter of the transistor Q6 is grounded via a resistor R6=100 kΩ. By contrast, the base of the transistor Q6 is connected to the control line 3 via a resistor R2=10 kΩ. This means that the emitter of the transistor Q6 follows the voltage level on the control line 3 up to the supply voltage as a maximum.

To evaluate the voltage profile, the emitter of the transistor Q6 is connected to the inverting input of a comparator 5, the noninverting input of the comparator 5 being connected to a reference voltage element 6 which delivers a reference voltage UTH=2.0 V. In addition, the inverting input of the comparator 5 is grounded via a capacitor C2=0.1 nF, the capacitor C2 and the resistor R6 forming an RC element whose time constant ensures that no interference ("glitches") arises during switching operations.

In addition, the driver circuit has a comparator 7 whose inverting input is connected to the emitter of the transistor Q5, while the reference voltage element 6 is connected to the noninverting input of the comparator 7. Furthermore, a buffer capacitor C1=0.1 nF is also grounded at the inverting input of the comparator 7, the buffer capacitor C1 forming an RC element with the resistor R5.

The outputs of the two comparators 5, 7 are connected to a NOR gate 8 which actuates the diagnostic output DIAG.

The text below first describes normal actuation of the control line 3 when there is neither a line interruption nor a battery or ground short.

In this case, the data to be transmitted are prescribed in digital form at the control input Vin of the driver circuit 1 by the engine controller 2 by virtue of the control input Vin being set either to a low level VLow=0 V or to a high level VHigh=5 V.

With a high level at the control input Vin, a current of approximately 10 mA flows via the resistor R1 and the transistor Q1 connected as a diode. Since the two transistors Q1 and Q2 form a current mirror circuit, a current of approximately 10 mA then also flows via the transistor Q2. This means that the voltage drop across the transistor Q2 is equal to the saturation voltage of approximately 0.2 V, so that a low level is output on the control line 3 in this case. In this state, the transistor Q3 is off, which means that the transistor Q4 is also off.

If the control input Vin for the driver circuit 1 is then actuated with a low level, no more current flows through the resistor R1, as a result of which the transistors Q1 and Q2 are off. With a low level at the control input Vin, however, the transistor Q3 is turned on, which means that the transistor Q4 is also on and then acts as a diode. The supply voltage V1 then drives a current via the transistor Q4 and the resistor R3, which charges the EMC capacitor CEMC and generates a high level of approximately 4 V on the ignition output stage 4.

A high level on the control input Vin thus results in a low level on the control line 3, whereas a low level on the control input Vin causes a high level on the control line 3.

Figure 2:
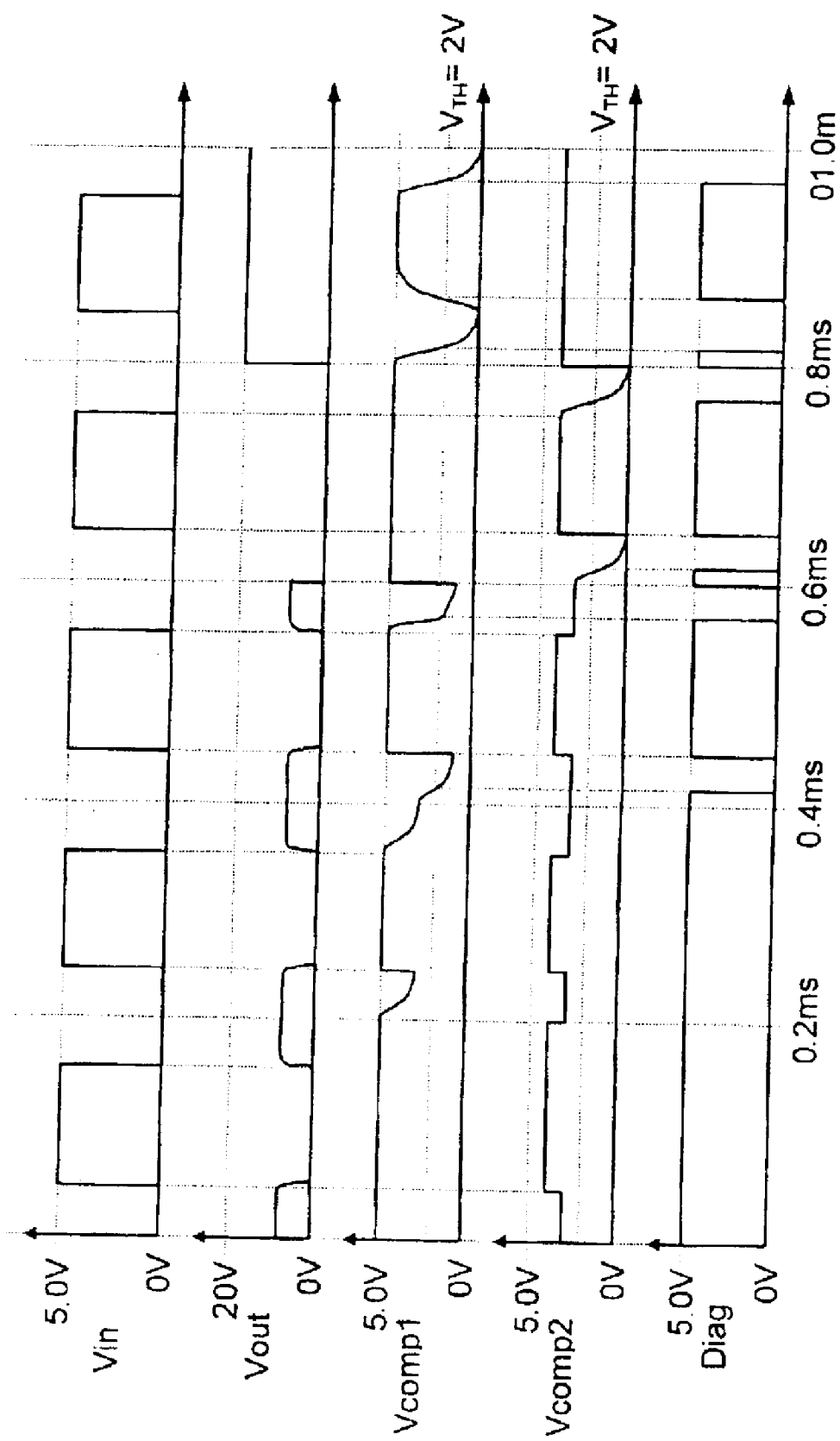
FIG. 2 shows a signal profile graph for the inventive driver circuit.

The text below now describes the diagnostic function of the inventive driver circuit 1, with fault-free operation first being assumed, in which there is neither ground or battery shorting nor line interruption. This operating state is portrayed between t=0 ms and t=0.4 ms on the signal graph shown in FIG. 2, the switch U1 being open in the time interval from t=0 ms to t=0.2 ms and the ignition output stage 4 drawing a correspondingly small amount of current, while the switch U1 is closed in the time interval from t=02 ms to t=0.4 ms and the ignition output stage draws correspondingly more current via the control line 3.

In the equivalent circuit diagram shown, the switch U1 is intended to illustrate operation of the circuit or diagnosis within the limit values of the load resistance from 2 kΩ to 200 kΩ. By contrast, the switch U1 is not present in the real application, since it is then not necessary to simulate the varying load resistance.

During this fault-free operation, the emitter of the transistor Q6 follows the peak value of the output voltage on the control line 3 up to the supply voltage V1 as a maximum as a result of actuation via the resistor R2. With a high level on the control line 3, this results in a voltage on the emitter of the transistor Q6 of more than 3V, and hence in a high level on the inverting input of the comparator 5.

If the control line 3 then changes from a high level to a low level, the voltage on the emitter of the transistor Q6 then falls with a time constant τ1=1/(R6·C6)=10 μs. However, the control input Vin is then already at a high level again which is also present on the emitter of the transistor Q6 via the diode D1. The buffering by the RC element comprising the resistor R6 and the capacitor C2 thus ensures that the voltage does not fall significantly upon switching, and therefore there is always a high level on the emitter of the transistor Q6 during fault-free operation. This normal high level on the emitter of the transistor Q6 is compared with the prescribed threshold value UTH=2 V by the comparator 5, so that a low level normally always appears at the output of the comparator 5.

During fault-free operation, the same current flows via the transistor Q5 as via the transistor Q4, since the two transistors Q4 and Q5 form a current mirror circuit. With a high level at the control input Vin, the control line 3 assumes a low level, in which case the two transistors Q5 and Q4 are off. The high level at the control input Vin then charges the capacitor C1 via the resistor R5, so that the inverting input of the comparator 7 is at a high level which is compared with the prescribed threshold value UTH=2 V. With a high level at the control input Vin and a low level on the control line, a low level thus appears at the output of the comparator 7 during fault-free operation.

If the control input Vin then changes to a low level, the transistor Q4 is turned on via the transistor Q6, so that the supply voltage V1 drives a current through the EMC capacitor CEMC and the ignition output stage 4 via the transistor Q4 and the resistor R3. This current is initially dominated by the charging current through the EMC capacitor CEMC and is initially around 45 mA. As the charging operation on the EMC capacitor CEMC abates, the output current is increasingly determined by the current through the ignition output stage 4, however. In this context, a current of the same magnitude flows through the transistor Q5, since the two transistors Q4 and Q5 form a current mirror circuit. While the EMC capacitor CEMC is being charged, there is certain to be a high level on the collector of the transistor Q5 and hence also on the inverting input of the comparator 7, since the voltage drop across the transistor Q5 is then equal to the relatively low saturation voltage. When the charging operation for the EMC capacitor CEMC has abated, the current through the transistor Q4 and hence also the current through the transistor Q5 are determined solely by the load current through the ignition output stage 4. Depending on the switching state of the switch U1, this load current is 2 mA or 20 µA. In both cases, this load current is sufficient to maintain a high level of more than 2 V on the inverting input of the comparator 7, however. During fault-free operation, there is thus always a low level at the output of the comparator 7 too, which means that the diagnostic line DIAG outputs a high level during fault-free operation on account of the interposed NOR gate 8.

The text below now describes the diagnostic behavior of the driver circuit 1 in the event of a short to ground, which corresponds to the two switches U3 and U4 being on. This fault situation is portrayed between t=0.6 ms and t=0.8 ms on the signal graph shown in FIG. 2.

In this case, irrespective of the actuation by the control input Vin, the control line 3 is always at a low level which actuates the transistor Q6 via the resistor R2, so that the potential on the inverting input of the comparator 5 likewise falls to a value of below 2 V. In the event of a ground short on the control line 3, the output of the comparator 5 thus produces a high level which is output via the NOR gate 8 as a low level on the diagnostic line DIAG.

The text below now describes the diagnostic behavior in the event of a battery short on the control line 3, which corresponds to the switch U5 being closed while the switches U3 and U4 are open. This fault situation is portrayed between t=0.8 ms and t=1.0 ms on the signal graph shown in FIG. 2.

In this fault situation, the supply voltage V1 cannot drive any more current via the transistor Q4 even when there is a low level on the control input Vin, since the battery voltage VB acts against this. Accordingly, no more current flows via the transistor Q5 either, which means that there is only a high level on the inverting input of the comparator 7 if the control input Vin prescribes a high level via the resistor R5. If the control input Vin then changes to a low level, however, the voltage at the input of the comparator falls below the threshold value of UTH=2V with the time constant τ1, which means that the output of the comparator 7 then produces a high level which is output via the NOR gate 8 as a low level on the diagnostic line.

Finally, the fault situation of a line interruption is now described, which corresponds to the switch U2 being open. This fault situation is portrayed between t=0.4 ms and t=0.6 ms on the signal graph shown in FIG. 2.

In this fault situation, the current through the transistor Q4 falls to zero when the charging operation on the EMC capacitor CEMC has abated, since the ignition output stage 4 cannot draw any current on account of the line interruption in the control line. Accordingly, the current through the transistor Q5 then also falls, since the two transistors Q4 and Q5 form a current mirror circuit. With a high level on the control input Vin, this does not affect the inverting input of the comparator 7, since the high level on the control input Vin also affects the inverting input of the comparator 7 via the resistor R5. However, if the control input Vin then changes to a low level, the buffer capacitor C1 discharges via the resistor R5, as a result of which the potential on the inverting input of the comparator 7 falls to below the threshold value UTH=2 V. In the event of a line interruption on the control line 3, the output of the comparator 7 thus produces a high level which is output as a low level on the diagnostic line as a result of the NOR gate 8 connected downstream.

Figure 3:
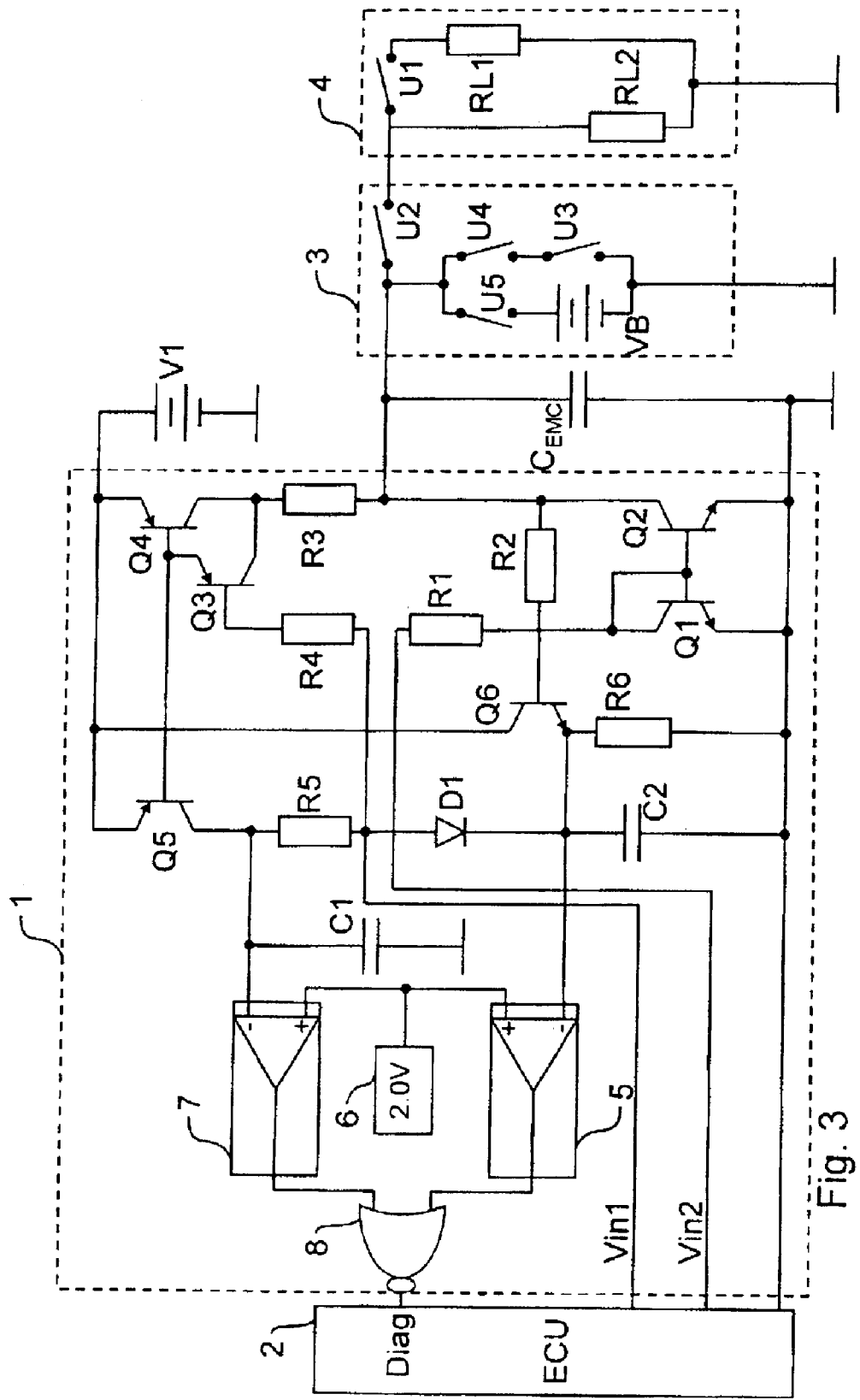
FIG. 3 shows an alternative exemplary embodiment of the inventive driver circuit with separate actuation of the two current mirror circuits.

The exemplary embodiment shown in FIG. 3 for an inventive driver circuit 1 largely matches the exemplary embodiment described above and shown in FIG. 1, which means that the same reference symbols are used below and reference is made to the description above in order to avoid repetition.

The particular feature of this exemplary embodiment is that the driver circuit 1 has two control inputs Vin1 and Vin2 which respectively actuate one of the two current mirror circuits. The control input Vin1 thus actuates the high-side current mirror circuit, comprising the transistors Q3, Q4 and Q5, via the resistor R4 while the control input Vin2 actuates the low-side current mirror circuit, comprising the transistors Q1 and Q2, via the resistor R1.

This separate actuation of the two current mirror circuits affords the advantage that the driver circuit 1 can be configured either as a high-side switch or as a low-side switch.

In addition, this also provides the opportunity to put the control output into a high-impedance state (tri-state) by turning off the two transistors Q4 and Q2.

What is claimed is:

1. A driver circuit for actuating an ignition output stage in an internal combustion engine via a control line and for diagnosing the state of the control line and of the ignition output stage, said driver circuit having a test circuit, connected to the control line, for measuring the electrical output current flowing via the control line, and an evaluation unit, connected to the test circuit, for generating a diagnostic signal on the basis of the measured output current, said test circuit has two current mirror circuits, the first current mirror circuit connected to the voltage side of the control line and the second current mirror circuit connected to the ground side of the control line, wherein said evaluation unit has two comparator units which respectively compare the output current or a signal derived from the output current with a prescribed threshold value and generates a diagnostic signal on the basis of said comparison.

2. The driver circuit as claimed in claim 1, wherein the current mirror circuit is in the form of an inverse current mirror circuit.

3. The driver circuit as claimed in claim 1, wherein the control line is grounded via a first capacitor in order to improve the electromagnetic compatibility.

4. The driver circuit as claimed in claim 1, wherein the input side of the evaluation unit is grounded via a buffer capacitor.

5. The driver circuit as claimed in claim 4, wherein the input side of the evaluation unit is grounded via an RC element.

6. The driver circuit as claimed in claim 5, wherein the time constant of the RC element is smaller than the switching time or is in the order of magnitude of the switching time.

7. The driver circuit as claimed in claim 6, wherein the time constant of the RC element is between 5 µs and 20 µs.

8. The driver circuit as claimed in claim 1, wherein the outputs of the two comparator units are connected to a logic circuit which generates the diagnostic signal on the basis of the output signal from the two comparator units.

9. The driver circuit as claimed in claim 8, wherein the logic circuit has an OR gate.

10. The driver circuit as claimed in claim 1, wherein the inputs of the current mirror circuits are connected to a single control input together.

11. The driver circuit as claimed in claim 1, wherein the inputs of the two current mirror circuits are connected to a respective control input separately.

12. A driver circuit for actuating an ignition output stage in an internal combustion engine via a control line and for diagnosing the state of the ignition output stage, said driver circuit having a test circuit connected to the control line for measuring the electrical output current flowing via the control line, and an evaluation unit connected to the test circuit for generating a diagnostic signal on the basis of the measured output current, the test circuit having two, first and second current mirror circuits, the first current mirror circuit connected to the voltage side of the control line, the second current mirror circuit connected to the ground side of the control line, and said evaluation unit comprising two comparator units which respectively compare the output current or a signal derived from the output current with a prescribed threshold value and generates the diagnostic signal on the basis of the comparison, wherein an input side of the evaluation unit is grounded via an RC element having a time constraint smaller than the switching time or is in the order of magnitude of the switching time.

13. The driver circuit as claimed in claim 12, wherein the current mirror circuit is in the form of an inverse current mirror circuit.

14. The driver circuit as claimed in claim 12, wherein the control line is grounded via a first capacitor in order to improve the electromagnetic compatibility.

15. The driver circuit as claimed in claim 12, wherein the time constant of the RC element is between 5 $\mu$s and 20 $\mu$s.

16. The driver circuit as claimed in claim 12, wherein the outputs of the two comparator units are connected to a logic circuit which generates the diagnostic signal on the basis of the output signal from the two comparator units.

17. The driver circuit as claimed in claim 12, wherein the inputs of the current mirror circuits are connected to a single control input together.

18. The driver circuit as claimed in claim 12, wherein inputs of the current mirror circuits are connected to a respective control unit separately.

* * * * *